United States Patent [19]

Hirayama

[11] Patent Number: 5,065,365

[45] Date of Patent: Nov. 12, 1991

[54] SEMICONDUCTOR MEMORY DEVICE CARRYING OUT READING AND WRITING OPERATIONS IN ORDER IN ONE OPERATING CYCLE AND OPERATING METHOD THEREFOR

[75] Inventor: Kazutoshi Hirayama, Hyogo, Japan

[73] Assignee: Mitsubishi Denki Kabushiki Kaisha, Tokyo, Japan

[21] Appl. No.: 663,787

[22] Filed: Mar. 4, 1991

Related U.S. Application Data

[63] Continuation of Ser. No. 338,836, Apr. 14, 1989, abandoned.

[30] Foreign Application Priority Data

Oct. 3, 1988 [JP] Japan .................. 63-249358

[51] Int. Cl.⁵ .................................. G11C 8/00
[52] U.S. Cl. ........................ 365/189.05; 365/230.08; 365/233
[58] Field of Search ............ 365/189.05, 189.04, 365/189.01, 193, 230.08, 233

[56] References Cited

U.S. PATENT DOCUMENTS

| | | | |
|---|---|---|---|
| 3,969,706 | 7/1976 | Proebsting et al. | 365/193 |
| 4,397,001 | 8/1983 | Takemae | 365/193 |
| 4,507,761 | 3/1985 | Graham | 365/193 |
| 4,794,567 | 12/1988 | Akatsuka | 365/189.05 |
| 4,905,189 | 2/1990 | Brunolli | 365/189.04 |
| 4,916,669 | 4/1990 | Sato | 365/189.04 |
| 4,933,909 | 6/1990 | Cushing et al. | 365/189.04 |

OTHER PUBLICATIONS

Shozo Saito et al, "A 1Mb CMOS DRAM with Fast Page and Static Column Modes", IEEE International Solid-State Circuits Conference 1985, pp. 252-253.

Primary Examiner—Stuart N. Hecker
Assistant Examiner—Michael A. Whitfield
Attorney, Agent, or Firm—Lower, Price, LeBlanc and Becker

[57] ABSTRACT

A dynamic random access memory, which includes a data input buffer, a data input latch circuit, a data output buffer, and a switching circuit. For example, in an operation in a read-write cycle, at first, a data signal to be written is stored in the latch circuit 7 concurrent with inputting of an address signal in response to a signal $\overline{WE}$. A data signal read from a memory cell is output via the output buffer in response to a signal $\overline{OE}$. The switching circuit is turned on, and the data signal which has been latched is provided to the memory cell via a pair of I/O lines. As a result, the time required for the operation in the read-write cycle is shortened.

10 Claims, 13 Drawing Sheets

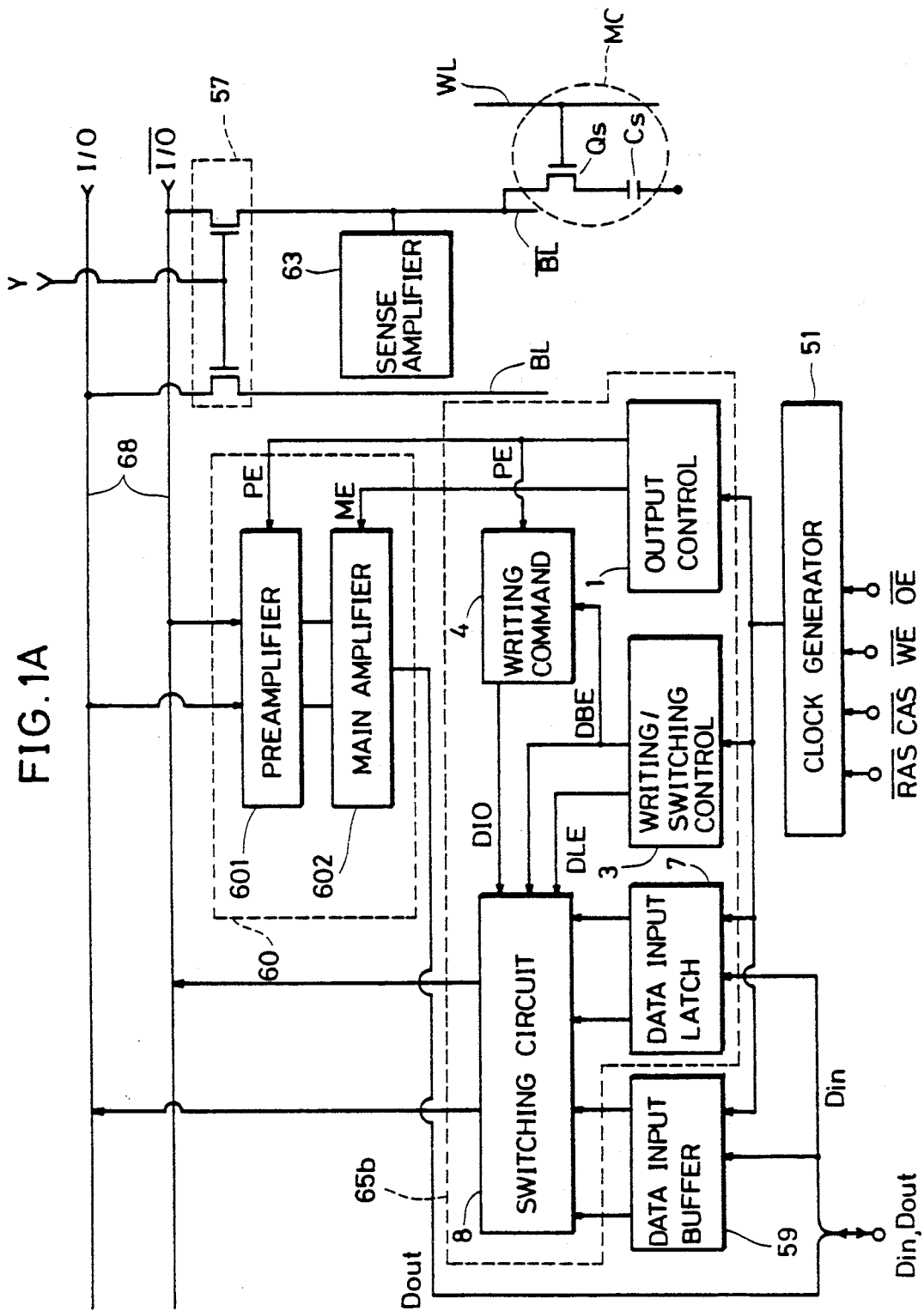

SEMICONDUCTOR MEMORY DEVICE CARRYING OUT READING AND WRITING OPERATIONS IN ORDER IN ONE OPERATING CYCLE AND OPERATING METHOD THEREFOR

This application is a continuation of U.S. Pat. application Ser. No. 07/338,836 filed Apr. 14, 1989, now abandoned.

BACKGROUND OF THE INVENTION

1. Field of the Invention

The present invention relates generally to a semiconductor memory device, and particularly to a semiconductor memory which carries out reading and writing operations in order in one operating cycle. The present invention has particular applicability to dynamic random access memory device.

2. Description of the Background Art

FIG. 5 is a block diagram showing one example of a generally known conventional dynamic random memory (hereinafter, it is called as a DRAM). Referring to FIG. 5, this DRAM includes a memory array 58 provided with memory cells for storing data signals, an address buffer 54 which receives address signals from the outside, a row decoder 55 and a column decoder 56 both of which decode address signals, and a sense amplifier 63 which is connected to the memory array 58 to amplify and read out signals stored in memory cells. An input buffer 59 for inputting data signals and an output buffer 60 for outputting signals are connected via I/O lines 68 and an I/O gate 57 to the memory array 58.

A clock generator 51 is connected so as to receive a row address strobe signal $\overline{RAS}$, a column address strobe signal $\overline{CAS}$, an output enable signal $\overline{OE}$, and a write enable signal $\overline{WE}$ all of which are provided from the outside and generates waveform-shaped signals of these signals and various clock signals. An I/O controller 65a is connected so as to receive signals which have been output by the clock generator 51 and controls a data input buffer 59 and a data output buffer 60.

FIG. 6A is a circuit diagram showing peripheral circuits of the memory array 58 of the DRAM shown in FIG. 5. FIG. 6B is a timing chart for explaining the operation of FIG. 5. These are shown, for example, in pp 252 to pp 253 of the digest of technical papers of the International Solid State Circuit Conference (ISSCC85) held in 1985.

Referring to FIG. 6A, a memory cell MC is connected between a bit line BLj and a word line WL1. The memory cell MC includes a capacitor Cs for storing data signals and a NMOS transistor Qs for switching. The sense amplifier 63 includes a CMOS flip-flop connected between the bit lines BLj and $\overline{BLj}$. The CMOS flip-flop is connected via a PMOS transistor Q11 and a NMOS transistor Q12 to a power source Vcc and a ground Vss. The transistors Q11 and Q12 are connected in such a manner that gates thereof receive trigger signals $\overline{So}$ and So, respectively.

A bit line pre-charge voltage (Hereinafter, it is called as $V_{BL}$) generating circuit is connected via an equalizing circuit 61 to the pair of bit lines BLj and $\overline{BLj}$. An I/O gate 57 composed of NMOS transistors Q8 and Q9 are connected between the pair of bit lines BLj and $\overline{BLj}$ and a pair of I/O lines 63. The transistors Q8 and Q9 are connected in such a manner that gates thereof receive a signal Yj from a column decoder. A signal generating circuit 64 is provided in order to generate control signals PR, EQ, So and $\overline{So}$ for controlling these circuits.

Next, referring to FIG. 6A and FIG. 6B, the reading operation and writing operation of the DRAM will be described.

At first, the equalizing signal EQ and the precharge signal PR are generated from the signal generating circuit 64. In response to these signals, transistors Q10, Q5, Q6 and Q7 are turned on, and the pair of bit lines BLj and $\overline{BLj}$ are equalized and brought into the voltage of $V_{BL}$ (In this example, it is a voltage Vcc/2). After the signal $\overline{RAS}$ falls, the signals EQ and PR fall to a low level. Subsequently, a word line signal WLi rises up to a high level, and a switching transistor Qs of the memory cell MC is turned on. The voltage of the bit line BLj varies slightly by receiving a signal from the memory cell MC. By this, a very small voltage difference is produced between the bit line BLj and the bit line $\overline{BLj}$ having the voltage $V_{BL}$.

On the other hand, at this time, the signals So and $\overline{So}$ vary, and the sense amplifier 63 is activated. As a result, the very small voltage difference generated between the bit lines is amplified by the sense amplifier 63. After this, the amplified data signal is provided via the transistors Q8 and Q9 to the pair of I/O lines 68 from the outside. In the case where this data signal is written into memory cell MC shown in FIG. 6A, the high level signals Yj and WLi are provided. As a result, the data signal to be written is stored via the transistor Q8, the bit line BLj, and the switching transistor Qs in a capacitor Cs.

FIG. 7 is a block diagram showing the circuit connections of the data input buffer 59, the data output buffer 60, and the I/O controller 65a to their peripheral circuits shown in FIG. 5. Referring to FIG. 7, the data output buffer 60 includes a preamplifier 601 connected thereto so as to receive a signal from the pair of I/O lines 68 and a main amplifier 602 connected to the output of the preamplifier 601. The preamplifier 601 is connected so as to receive a signal PE for activating thereof from the I/O controller 65a. The main amplifier 602 is also connected so as to receive a signal ME for activating thereof. The output of the main amplifier 602 is connected to an input/output terminal. On the other hand, the data input buffer 59 is connected via the data input/output terminal so as to receive the data signal to be written from the outside. The output of the data input buffer 59 is connected to the pair of I/O lines 68. The data input buffer 59 is connected so as to receive a switching control signal DBE from the I/O controller 65a.

The I/O controller 65a is connected to the clock generator 51 so as to receive the signals $\overline{RAS}$, $\overline{CAS}$, $\overline{WE}$, and $\overline{OE}$ all of which are waveform-shaped by the clock generator 51. The I/O controller 65a includes an output control circuit 1 for controlling the data output buffer 60 and a writing control circuit 2 for controlling the data input buffer 59. The output control circuit 1 supplies the signal PE to the preamplifier 601 and the signal ME to the main amplifier 602. The writing control circuit 2 supplies the signal DBE to the data input buffer 59.

Now, the signals $\overline{RAS}$ and $\overline{CAS}$ provided from the outside can be understood as those which control a state of a DRAM. One operation cycle of the DRAM is provided by one cycle of a state control signal. For example, a period till the signal $\overline{RAS}$ falls again after it has fallen and risen up is called as one cycle.

The DRAM has an ordinary reading cycle (or reading mode) during which a reading operation is carried out one time and its ordinary writing cycle (or writing mode) during which its writing operation is done one time in its one cycle. In addition to this, the DRAM has a mode in which its reading and writing operations are carried out in order. In other words, the DRAM can carry out operations in a read-write cycle (mode) and a read modify write cycle (mode).

FIG. 8A is a timing chart for explaining the operation in an ordinary reading cycle of the DRAM shown in FIG. 7. Referring to FIG. 7 and FIG. 8A, in an ordinary reading operation, the signals $\overline{RAS}$ and $\overline{CAS}$ fall in order. An address signal AD is input in response to these signals, and a row address signal RA and a column address signal CA are held in the DRAM. The memory cell MC is specified by decoding the held signals RA and CA. The sense amplifier 63 amplifies and reads out a data signal stored in the memory cell MC. The I/O gate 57 is turned on in response to a signal Y obtained by decoding the signal CA, and the data signal from the memory cell MC is provided to the pair of I/O lines 68.

Next, the output enable signal $\overline{OE}$ falls. The output control circuit 1 in the I/O controller 65a outputs the activating signals PE and ME in order in response to the signal $\overline{OE}$. The preamplifier 601 and the main amplifier 602 are activated respectively in response to the signals PE and ME to amplify the data signal on the pair of I/O lines 68. The amplified data signal Dout is output via the data input/output terminal to the outside. The time Tr required for these operations, that is, the ordinary reading cycle from the time till the signal $\overline{RAS}$ begins to fall until it has risen and begins to fall again, is for example about 190 ns.

FIG. 8B is a timing chart for explaining the operation in an ordinary writing cycle of the DRAM shown in FIG. 7. Referring to FIG. 7 and FIG. 8B, the row address signal RA and the column address signal CA are held in response to falling of the signals $\overline{RAS}$ and $\overline{CAS}$. A data signal to be written Din is provided via the data input/output terminal. The data input buffer 59 receives the data signal Din to provide it to the pair of I/O lines 68 in response to the signal DBE from the writing control circuit 2. When the data signal Din is written in the memory MC shown in FIG. 7, the I/O gate 57 is turned on in response to the signal Y obtained by decoding the signal CA. Since the switching transistor Qs in the memory cell MC is turned on in response to the signal obtained by decoding the row address signal RA, the data signal Din is stored in the capacitor Cs. The time Tw required for the operation, that is, the ordinary writing cycle is, for example, about 190 ns.

FIG. 8C is a timing chart for explaining the operation in an ordinary read-write cycle of the DRAM shown in FIG. 7. Referring to FIG. 7 and FIG. 8C, in the first half of the read-write operation cycle, at first, the signals $\overline{RAS}$ and $\overline{CAS}$ fall in order. The row address signal and the column address signal CA are held in response to these signals. In the same way as an ordinary reading operation, the data signal stored in the memory cell MC specified by the address signals RA and CA is read out to the pair of I/O lines 68. The preamplifier 601 and the main amplifier 602 are activated in response to the signals PE and ME from the output control circuit 1 in order. As a result, the read out data signal Dout is output via the data input/output terminal.

In the second half of the operation cycle, the activation of the main amplifier 602 is completed in response to the rise of the signal $\overline{OE}$. Next, the data signal Din to be written is provided via the data input/output terminal. The data input buffer 59 receives this data signal Din and provides it to the pair of I/O lines 68 in response to the signal DBE from the writing control circuit 2. The data signal Din provided to the pair of I/O lines 68 is written into the memory cell MC specified by the address signals RA and CA in the same way as an ordinary writing operation. The time Trw required for these operations, that is, for those in the read-write cycle becomes, for example, about 245 ns.

In a conventional DRAM, the time (for example, about 245 ns) required for the operations in the above mentioned read-write cycle and read-modify-write cycle is longer than the time (for example, 190 ns) required for an ordinary reading operation or writing operation. The reason is that in the one operation cycle, the writing operation is started after having completed the reading operation.

SUMMARY OF THE INVENTION

One object of the present invention is to reduce the time required for performing reading operations and writing operations in order in one operating cycle in a semiconductor memory device.

Another object of the present invention is to reduce the time required for performing reading operations and writing operations in order in one operating cycle in a dynamic random access memory device.

A further object of the present invention is to reduce the cycle time required for the operation in a read-write cycle or in a read-modify-write cycle in a dynamic random access memory device.

Briefly described, a semiconductor memory device according to the present invention includes a memory array having memory cells for storing data signals, I/O lines connected to the memory array for inputting/outputting the data signals to the memory array, a latch circuit for latching data signals to be written in response to a state control signal provided from the outside, an output buffer connected so as to receive data signals read out from the memory array in response to the state control signal via the I/O lines, and a switching circuit connected between the latch circuit and the I/O lines and turned on in response to a writing control signal from the outside.

In operation, the following reading operation and writing operation are performed in order in one operating cycle specified by one cycle of the state control signal. In other words, at first, the data signal stored in the memory cells of the memory array is read out in response to the state control signal. The read out data signal is provided via the I/O lines to the output buffer. The output buffer outputs the data signal in response to a reading control signal provided from the outside. When the data signal from the memory array are read out, simultaneously the data signal to be written is latched in the latch circuit in response to the state control signal. Just after the read out data signal is output from the output buffer, the switching circuit is turned on in response to the writing control signal. Since the data signal to be written has been already latched in the latch circuit, it is immediately provided via the switching circuit to the I/O lines. In this way, since reading of the data signal in the memory array and inputting of the data signal to be written are performed concurrently, that is, simultaneously in a certain period, which allows the cycle time to be reduced.

In another aspect, a semiconductor memory device according to the present invention includes a memory array having memory cells for storing data signals, a I/O lines connected to the memory array for inputting-/outputting the data signals to the memory array, a latch circuit for latching data signals to be written in response to a state control signal provided from the outside, an output buffer connected so as to receive data signals read out from the memory array via the I/O lines in response to the state control signal, and a switching circuit connected between the latch circuit and the I/O lines and turned on in response a writing control signal from the outside. In addition, a method of operation according to the present invention by which such the memory devices is operated includes the steps of latching the data signals to be written in response to the state control signal, providing the data signals stored in the memory cells of the memory array via the I/O lines to the output buffer, outputting signals held in the output buffer in response to a reading signal from the output buffer, turning on the switching circuit in response to the writing control signal, and providing the data signals latched in the latch circuit via the switching circuit and the I/O lines.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1A is a block diagram, showing an embodiment according to the present invention, that is, circuit connections of an I/O switching control circuit, a data input buffer, and a data output buffer to their peripheral circuits.

DESCRIPTION OF THE PREFERRED EMBODIMENTS

Figure 1B:
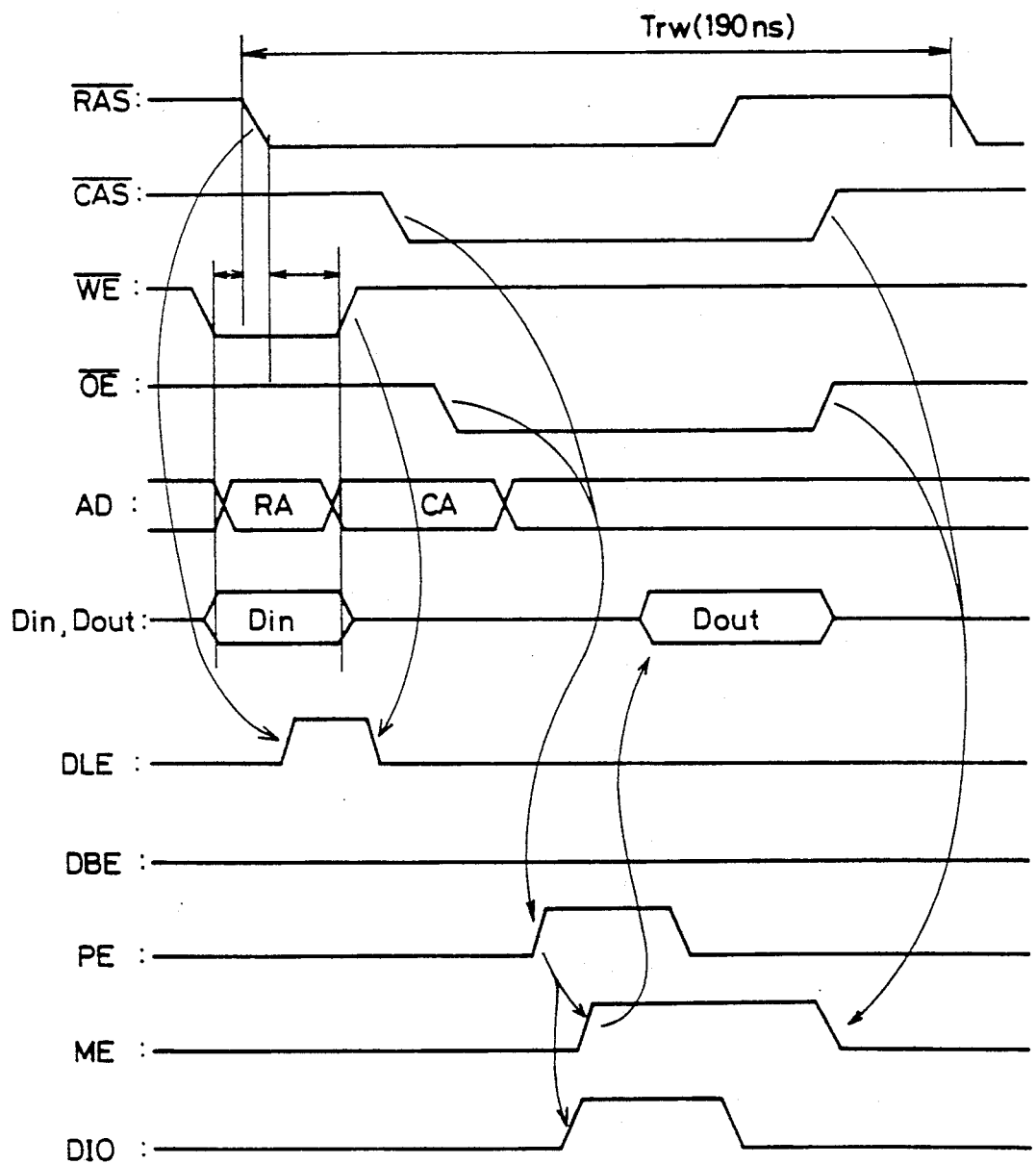
FIG. 1B and FIG. 1C are timing charts for explaining the operation of the circuit shown in FIG. 1A.

FIG. 1A is a block diagram showing circuit connections of a data input buffer 59, a data output buffer 60, and an I/O switching control circuit 65b to their peripheral circuits. Referring to FIG. 1A, the I/O switching control circuit 65b includes a data input latch circuit 7 connected so as to receive a data signal Din to be written via a data input/output terminal, a switching circuit 8 connected so as to receive signals from the data input buffer 59 and the data input latch circuit 7 for providing either one of the signals to a pair of I/O lines 68, and three control circuits 1, 3, and 4 connected so as to receive signals $\overline{RAS}$, $\overline{CAS}$, $\overline{WE}$, and $\overline{OE}$ via a clock generator 51.

Figure 7:
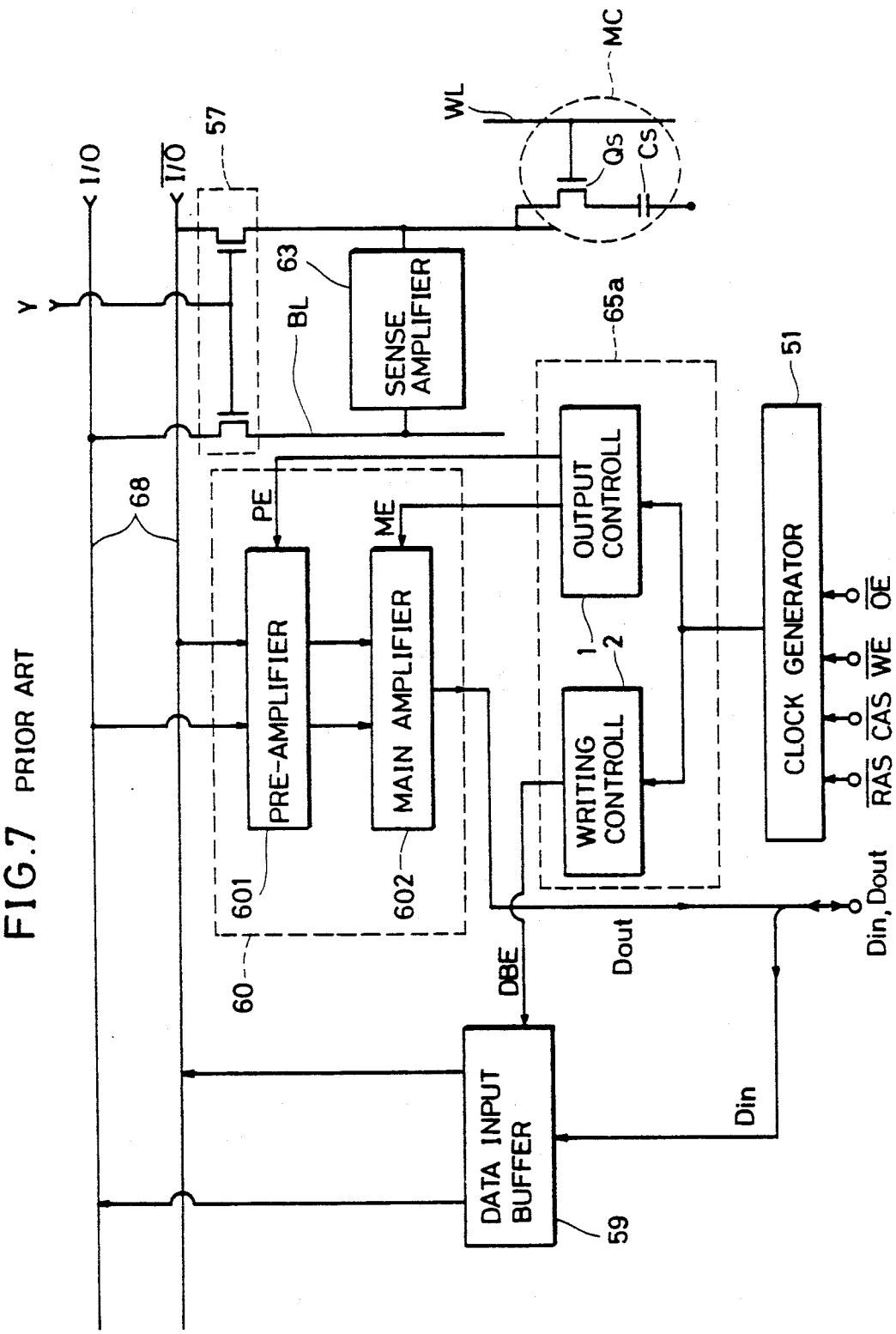
FIG. 7 is a block diagram showing circuit connections of the data input buffer, the data output buffer, and the I/O controller to their peripheral circuits shown in FIG. 5.

A writing/switching control circuit 3 is connected so as to receive the signals $\overline{RAS}$, $\overline{CAS}$ and $\overline{WE}$ to output two switching signals DLE and DBE. A writing command circuit 4 is connected so as to receive the signal DBE and a signal PE to output a switching signal DIO in response these signals. An output control circuit 1 is provided in order to output the signal PE and a signal ME for activating a preamplifier 601 and a main amplifier 602. Comparing a DRAM shown in FIG. 1A with the conventional one shown in FIG. 7, except that the I/O switching control circuit 65b is provided in place of the I/O controller 65a, the configuration of the other circuits is the same as that of the conventional one. The description of the DRAM will be, therefore, omitted.

FIG. 1B is a timing chart for explaining the operation in a read-write cycle of the DRAM shown in FIG. 1A. Referring FIG. 1A and FIG. 1B, next the operation in the read-write cycle of the DRAM will be described.

At first, the data signal Din to be written is provided to a data input/output terminal, and simultaneously the write enable signal $\overline{WE}$ falls. Subsequently, the signals $\overline{RAS}$ and $\overline{CAS}$ fall in order, and a row address signal RA and a column address signal CA are held in the DRAM. The data signal Din provided to the data input/output terminal is held in the data input latch circuit 7 in response to the fall of the signal $\overline{RAS}$. Further, at this time, the switching circuit 8 is off in response to the low level of signal DIO.

On the other hand, the data signal stored in the memory cell MC is provided to a bit line $\overline{BL}$ in response to a word line signal obtained by decoding the row address signal $\overline{RA}$. The sense amplifier 63 amplifies the signal. Since an I/O gate 57 is turned on in response to a signal Y obtained by decoding the column address signal CA, the amplified data signal is provided to the pair of I/O lines 68.

The output control circuit 1 outputs the activation signals PE and ME in order in response to the fall of the signals $\overline{CAS}$ and $\overline{OE}$. The preamplifier 601 and the main amplifier 602 are activated in order in response to the signals PE and ME. As a result, the data signal from the memory cell MC which has been provided to the pair of I/O lines is amplified and output via the data input/output terminal Din, Dout.

On the other hand, a writing command circuit 4 outputs the signal DIO for switching to a switching circuit 8 in response to the activation of the preamplifier 601. The switching circuit 8 is turned on in response to the signal DIO, and the data signal Din to be written which has been held in the data input latch circuit 7 is supplied to the pair of I/O lines 68 via the switching circuit 8. The data signal Din supplied to the pair of I/O lines 68 is stored in the memory cell MC specified by the column address signal CA and the row address signal RA.

As described above, in this DRAM, the signals $\overline{RAS}$ and $\overline{CAS}$ fall in order, and concurrently the write enable signal $\overline{WE}$ falls. As a result, the taking in of the address signals RA and CA is performed concurrently with the taking in of the data signal to be written Din. Accordingly, the time Trw required for the operation in a read-write cycle can be made approximately equal to that required for an ordinary reading operation or an ordinary writing operation, that is, about 190 ns.

Figure 1C:
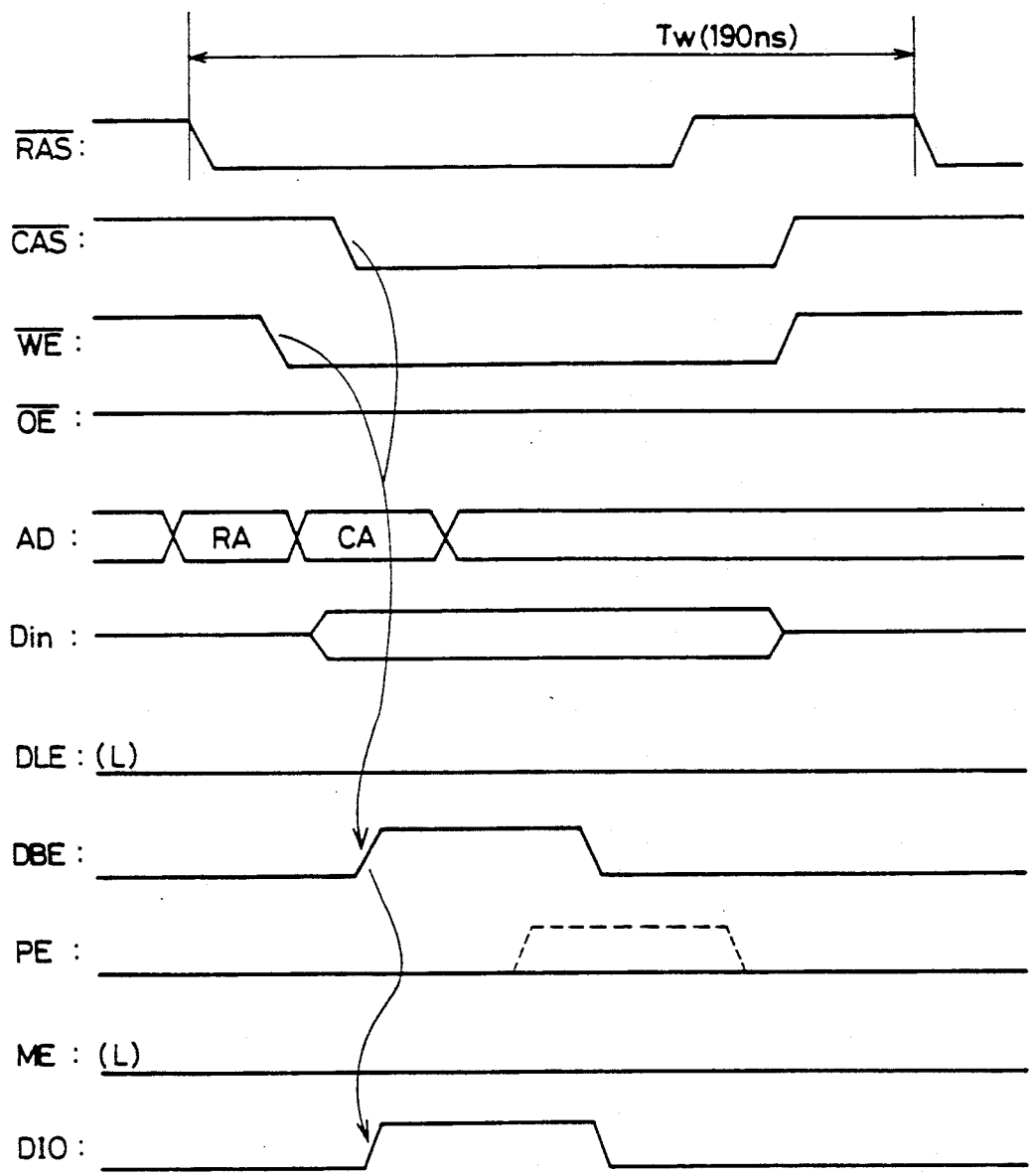

FIG. 1C is a timing chart for explaining the operation of the DRAM shown in FIG. 1A in an ordinary writing cycle. Referring to FIG. 1A and FIG. 1C, next the ordinary writing operation will be described.

The signals $\overline{RAS}$ and $\overline{CAS}$ fall in order, and the address signals RA and CA are held in the DRAM. The signal $\overline{WE}$ falls, and the data signal to be written Din is supplied to the data input/output terminal. The writing/switching control circuit 3 outputs the switching control signal DBE in response to the fall of the signals $\overline{CAS}$ and $\overline{WE}$. The write command circuit 4 outputs the high level signal DIO in response to the signal DBE. The switching circuit 8 is turned on in response to the signals DBE and DIO and supplies the data signal to be written Din stored in the data input buffer 59 selectively to the pair of I/O lines 68. The data signal Din provided to the pair of I/O lines 68 in written into the memory cell MC specified by the address signals RA and CA. The time Tw required to perform the above mentioned ordinary writing operation is the same as a conventional one, that is, about 190 ns.

Figure 8A:
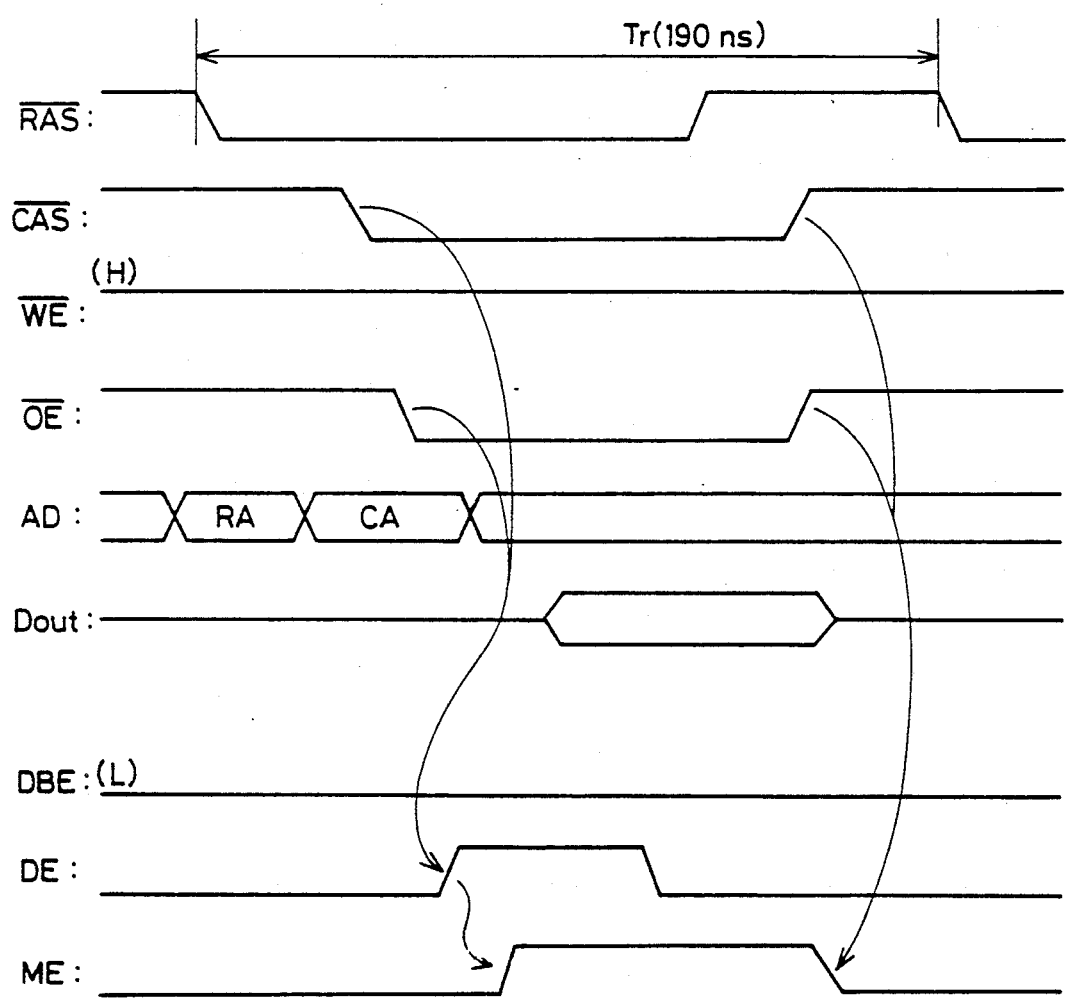
FIG. 8A to FIG. 8C are timing charts for explaining the operations of the circuits shown in FIG. 7.
Figure 8B:
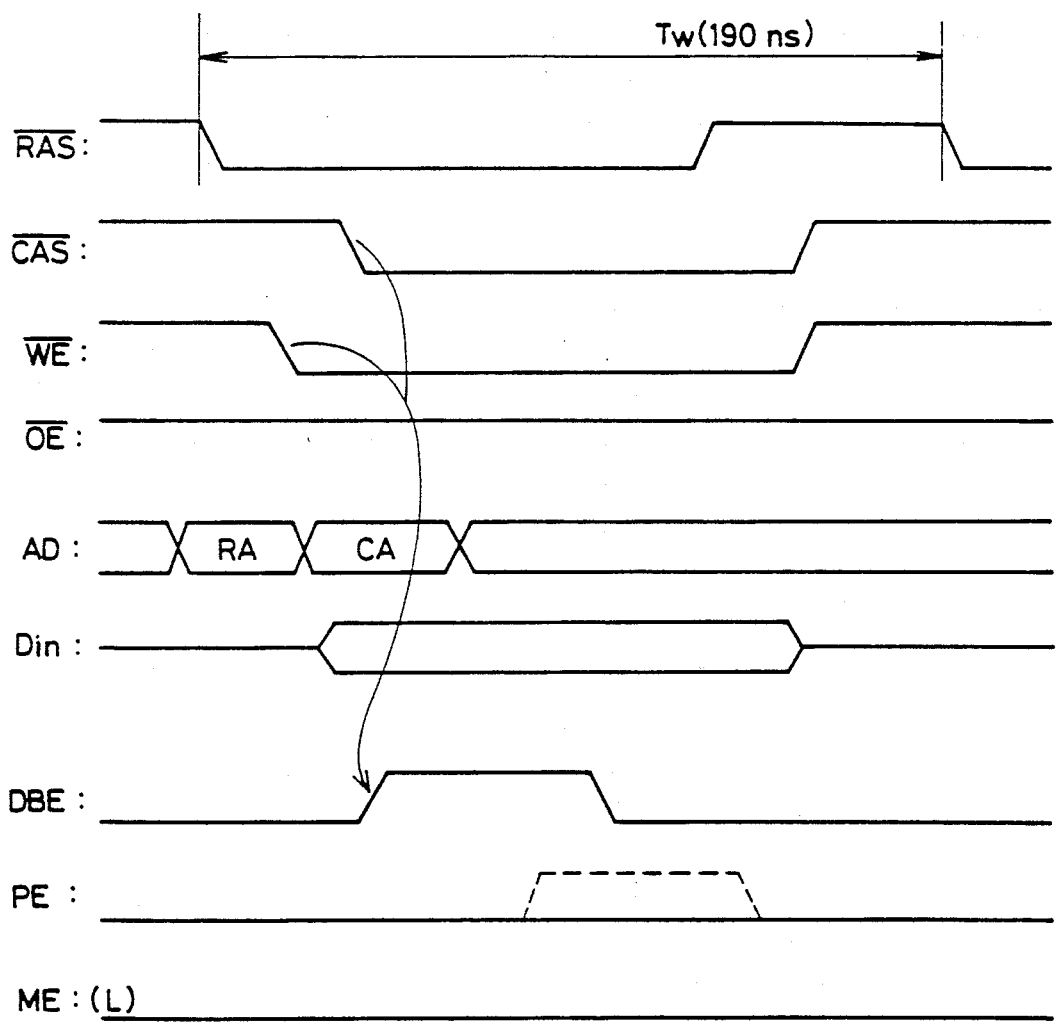
Figure 8C:
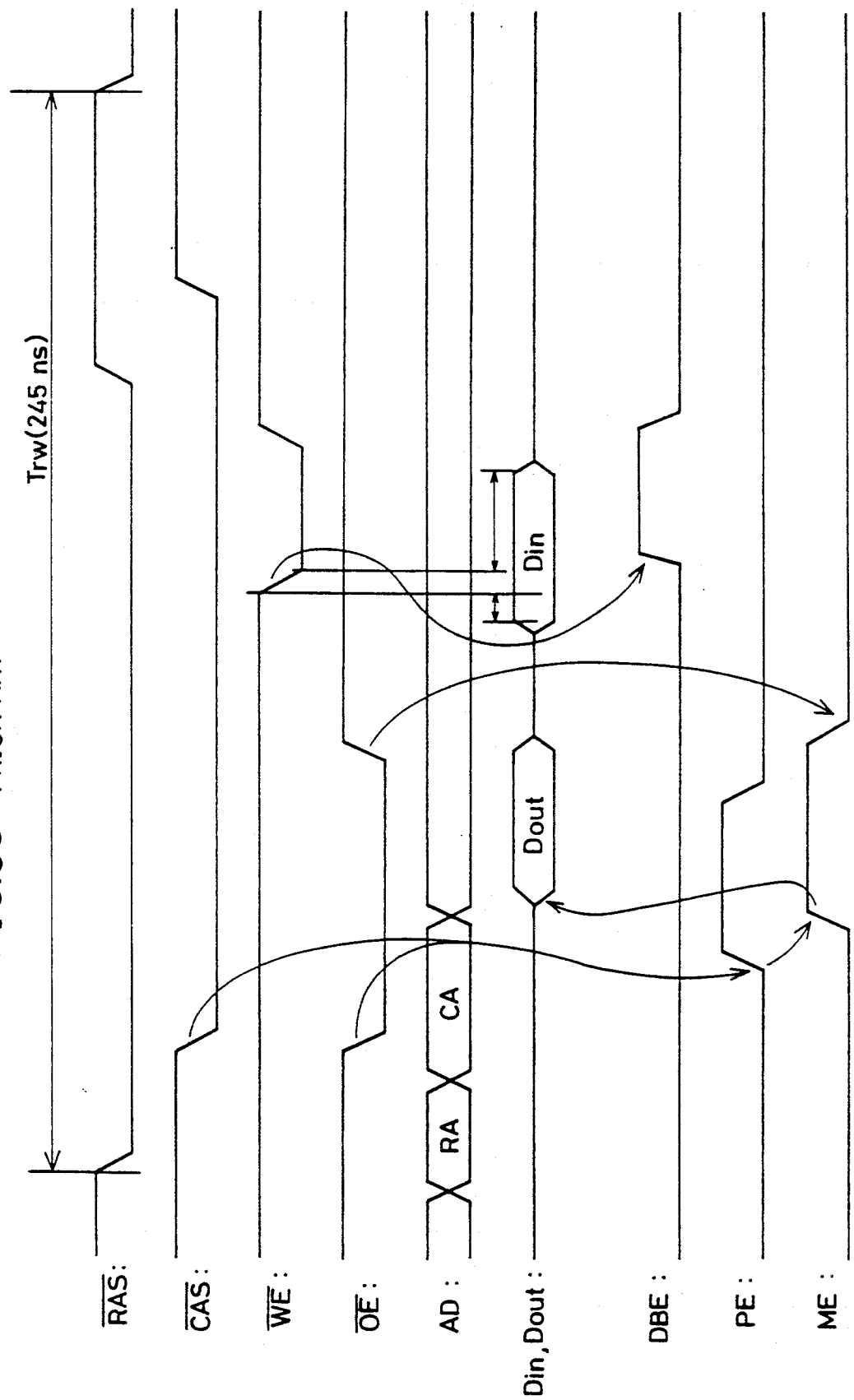

Incidentally, since the operation of the DRAM shown in FIG. 1A in an ordinary reading cycle is the same as the conventional operation which has been explained using FIG. 8A, the explanation will be omitted.

Figure 2:
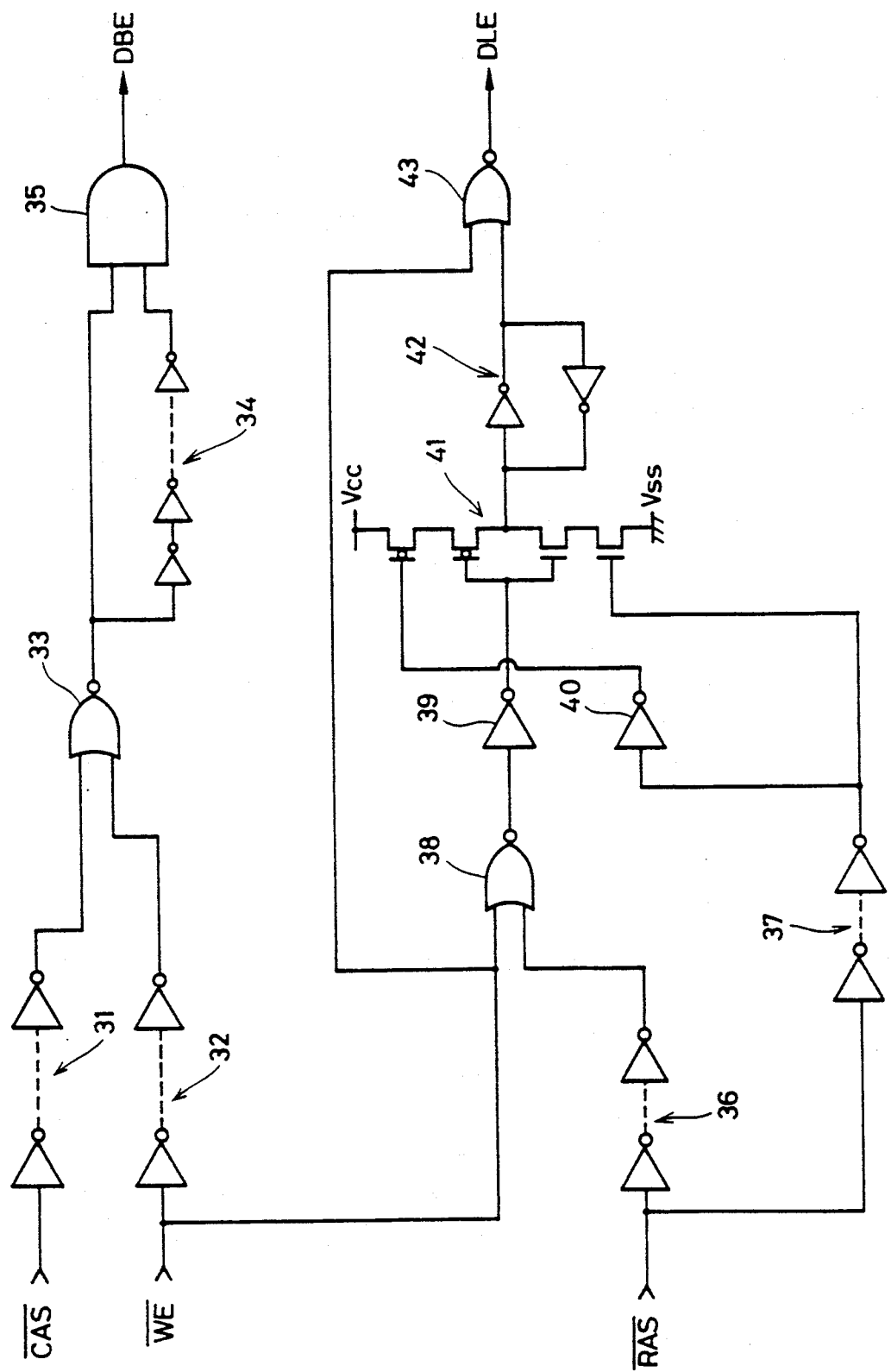
FIG. 2 is a circuit diagram showing one example of a writing/switching control circuit shown in FIG. 1A.

FIG. 2 is a circuit diagram showing one example of the writing/switching control circuit 3 shown in FIG. 1A. Referring to FIG. 2, the writing/switching control circuit 3 shown in FIG. 1A. Referring to FIG. 2, the writing/switching 3 includes a writing control unit for generating the writing control signal DBE in response to the signals $\overline{CAS}$ and $\overline{WE}$ and a switching control unit for generating the switching control signal DLE in response to the signals $\overline{RAS}$ and WE. The writing control unit includes delay circuits 31 and 32 each of which is composed of a series connection of an even number of inverters, a NOR gate 33, a delay circuit 34 composed of a series connection of an odd number of inverters, and a NAND gate 35. The switching control unit includes a delay circuit 36 composed of a series connection of an even number of inverters, a NOR gate 38, a delay circuit 37 composed of a series connection of an even number of inverters, two inverters 39 and 40, a series connection 41 of a PMOS transistor and a NMOS transistor both connected between the power source Vcc and the ground Vss, a latch circuit 42, and a NOR gate 43. The delay time owing to the delay circuit 37 is set to be larger than that owing to the delay circuit 36.

Figure 3A:
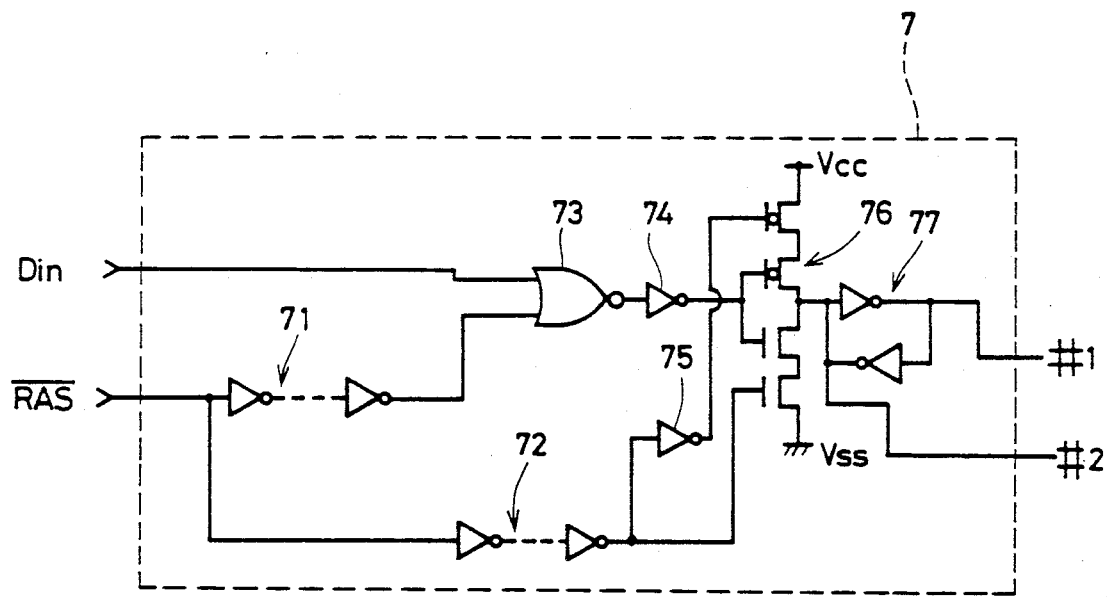
FIG. 3A is a circuit diagram showing one example of each of the data input latch circuit and the data input buffer shown in FIG. 1A.
Figure 3A:
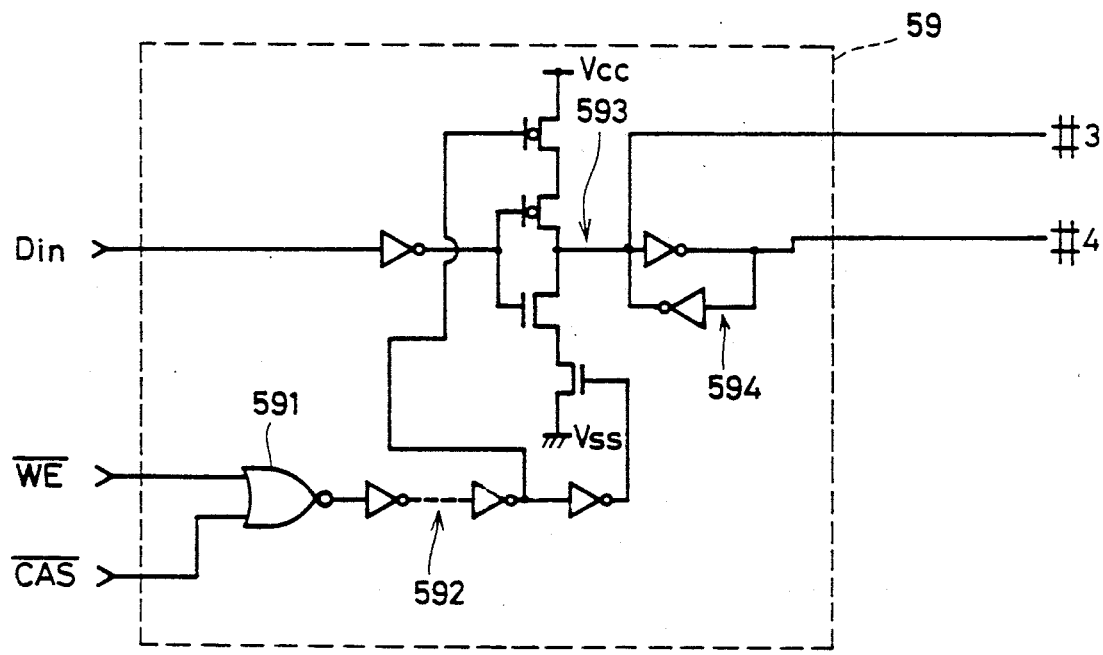

FIG. 3A is a circuit diagram showing one example of the data input latch circuit 7 and the data input buffer 59 as shown in FIG. 1A. Referring to FIG. 3A, the data input latch circuit 7 includes delay circuits 71 and 72 each of which is composed of a series connection of an even number of inverters, a NOR gate 73, two inverters 74 and 75, a series connection 76 of PMOS transistors and NMOS transistors connected between the power source Vcc and the ground Vss, and a latch circuit 77. The delay time owing to the delay circuit 72 is set to be larger than that owing to the delay circuit 71. The data input buffer 59 includes a NOR gate 591, a delay circuit 592 composed of a series connection of an even number of inverters, a series connection 593 of PMOS transistors and NMOS transistors connected between the power source Vcc and the ground Vss, and a latch circuit 594.

Figure 3B:
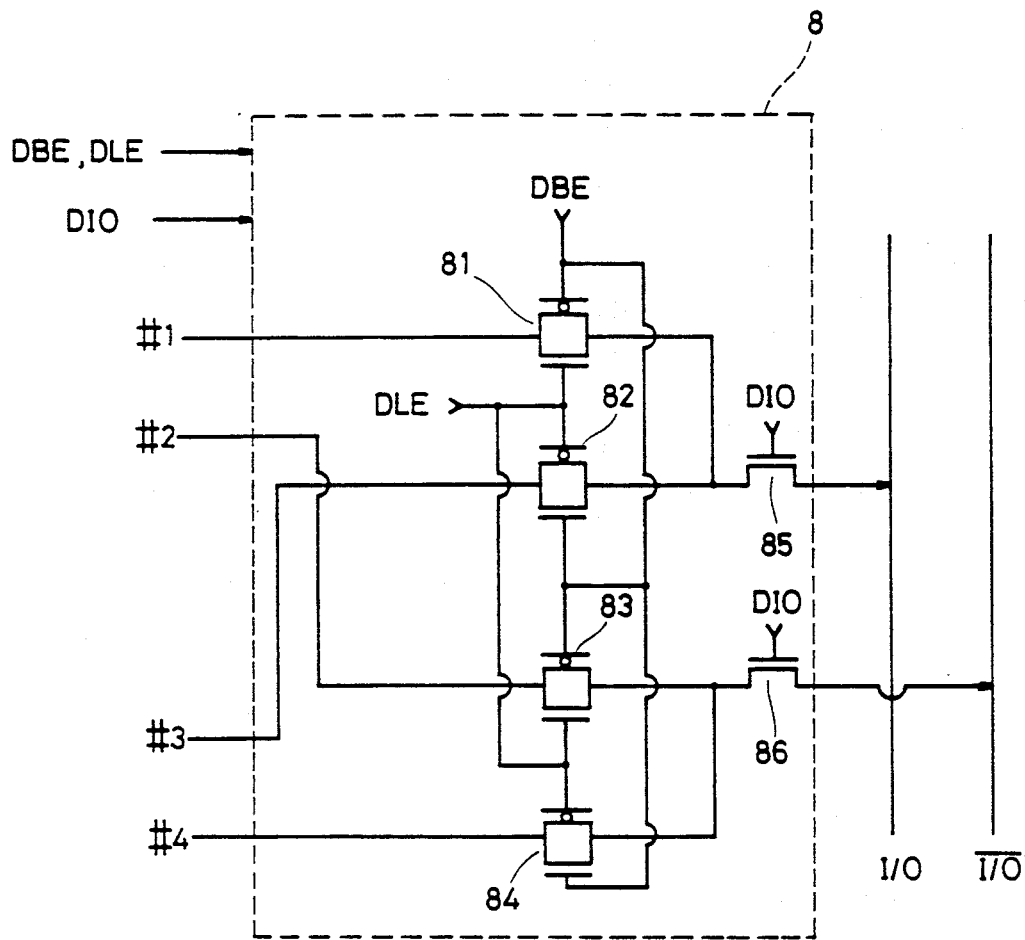
FIG. 3B is a circuit diagram showing an example of the switching circuit shown in FIG. 1A.

FIG. 3B is a circuit diagram showing one example of the switching circuit 8 shown in FIG. 1A. Referring to FIG. 3B, the switching circuit 8 includes four transmission gates 81 through 84 each of which is composed of a parallel connection of a PMOS transistor and a NMOS transistor, and MOS transistors 85 and 86 for switching.

Figure 4:
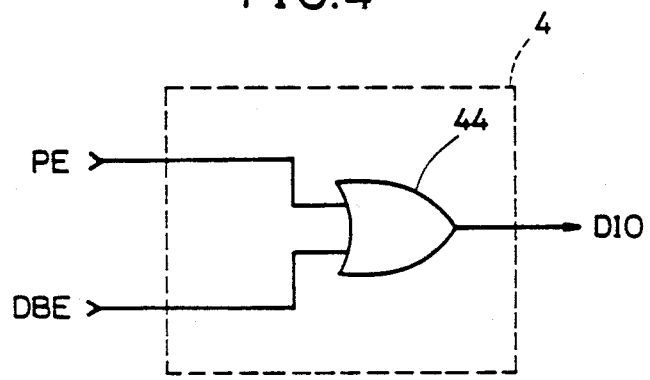
FIG. 4 is a circuit diagram showing one example of a write command circuit shown in FIG. 1A.
Figure 5:
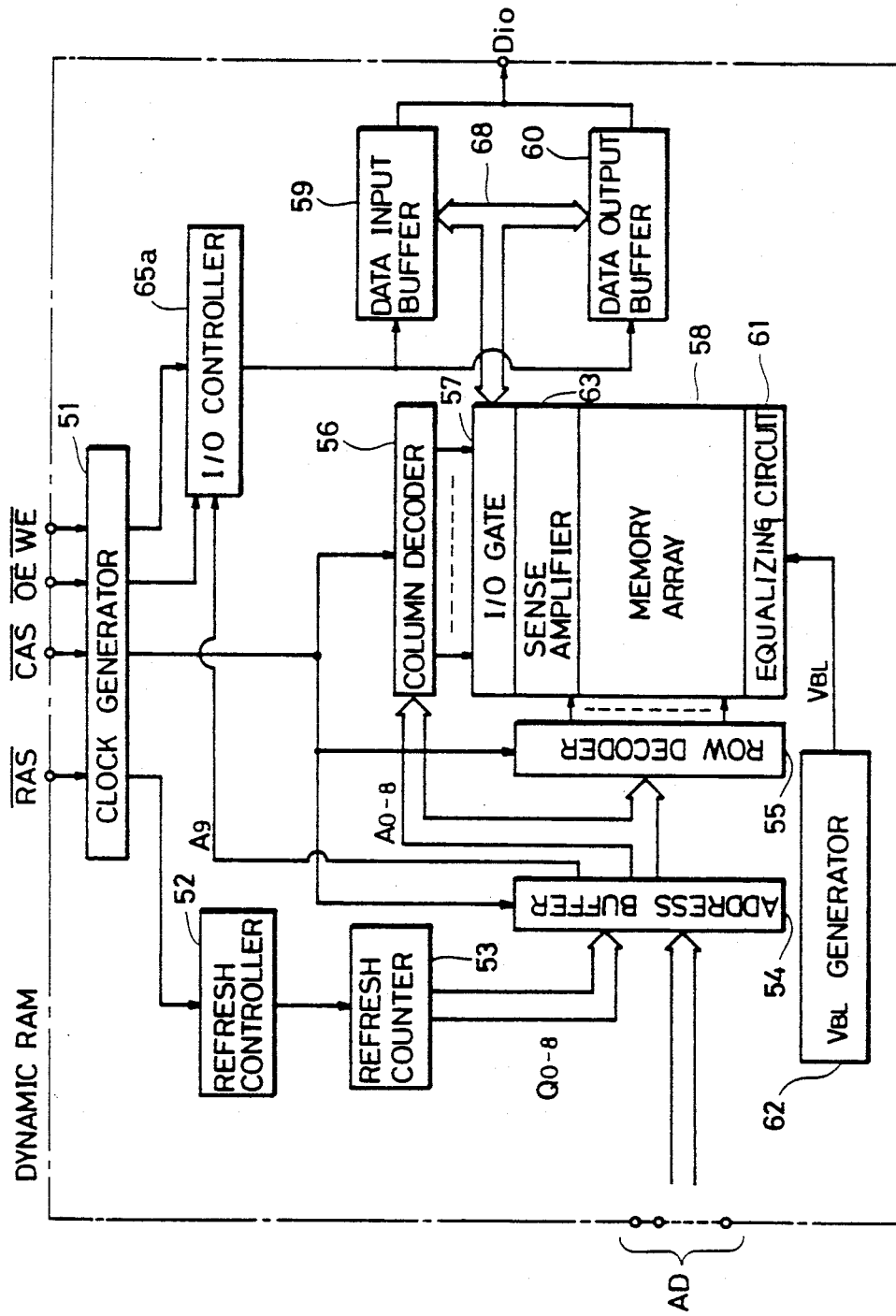
FIG. 5 is a block diagram showing a conventional DRAM.
Figure 6A:
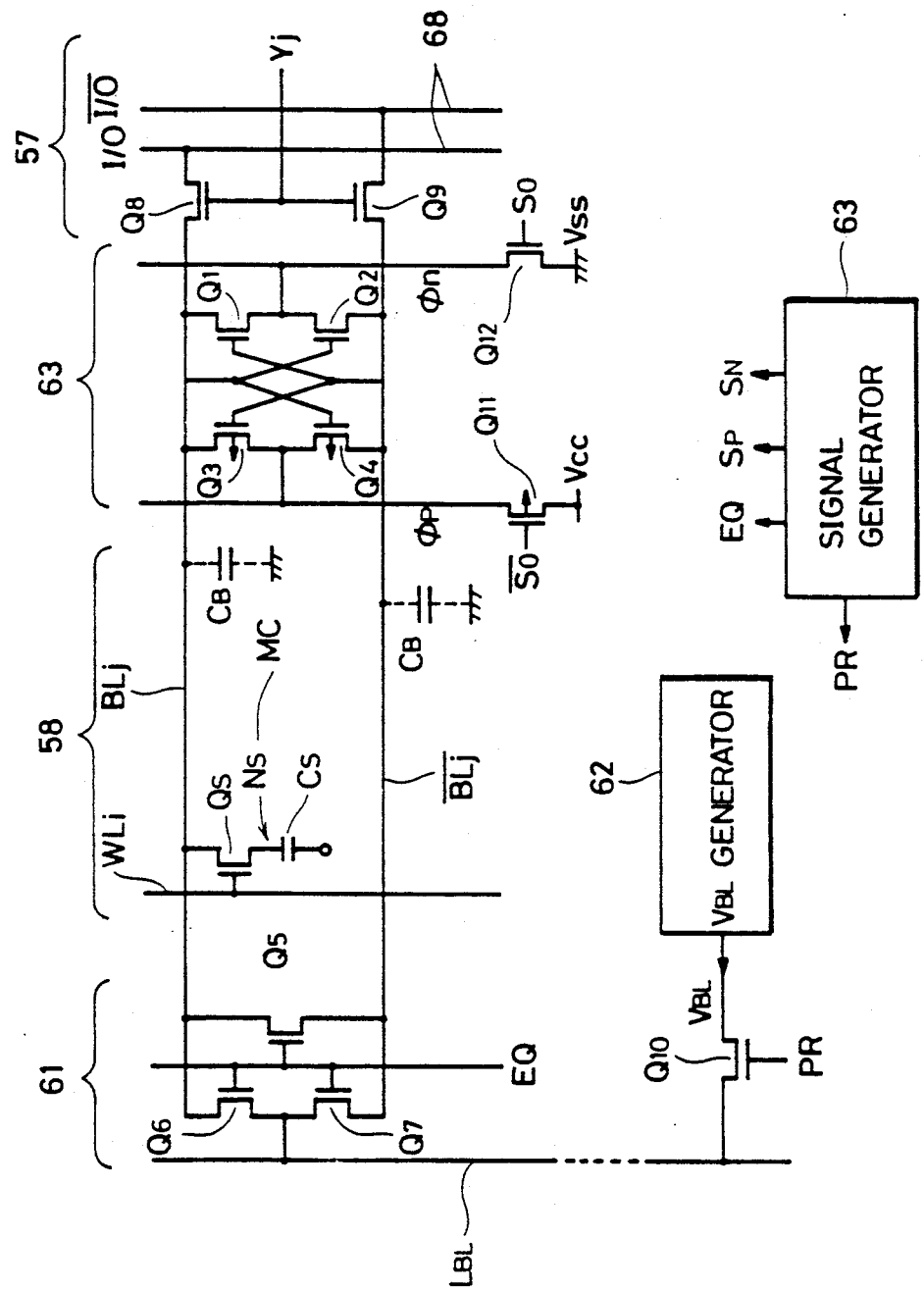
FIG. 6A is a circuit diagram showing a circuit connected to a pair of bit lines in the DRAM shown in FIG. 5.
Figure 6B:
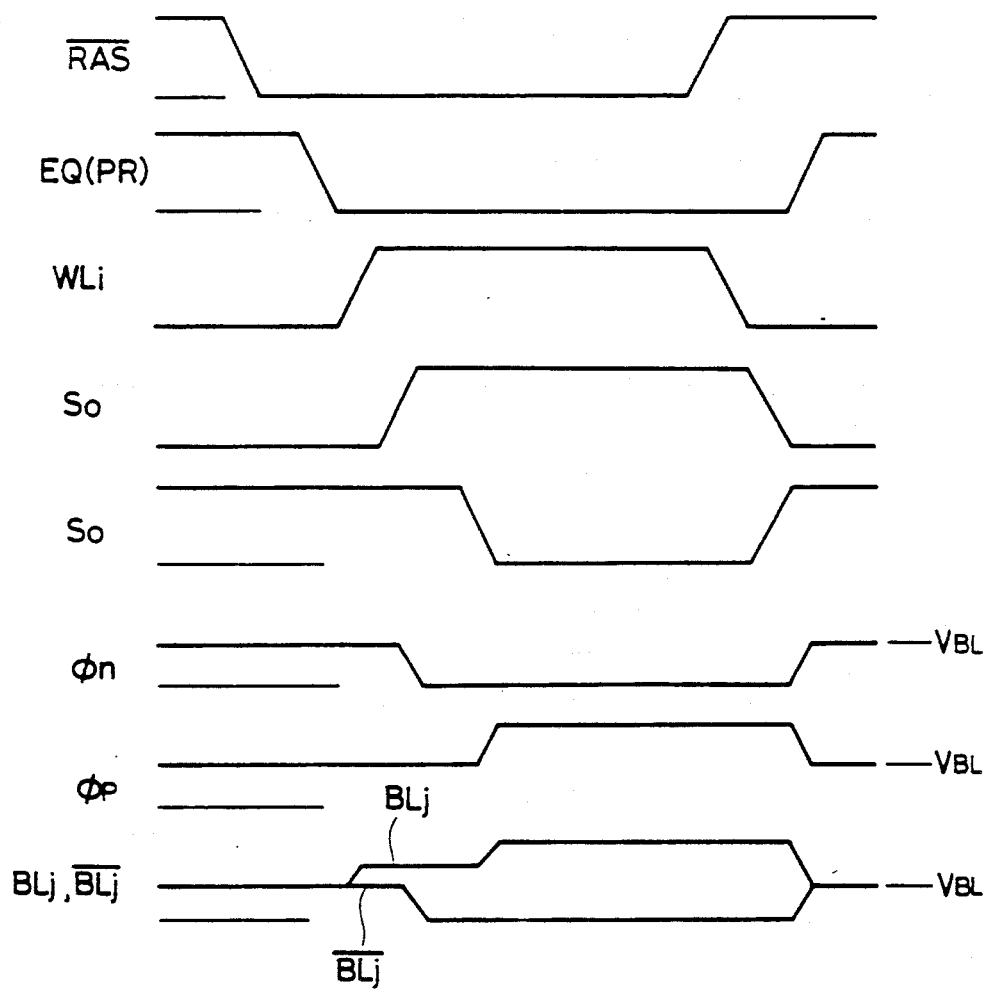
FIG. 6B is a timing chart for explaining the operation of the circuit shown in FIG. 6A.

FIG. 4 is a circuit diagram showing one example of the write commanding circuit 4 shown in FIG. 1A. Referring to FIG. 4, the write commanding circuit 4 includes an OR gate 44 connected so as to receive the signals PE and DBE.

A switching circuit for controlling at least the connection between the data input latch circuit 7 and the pair of I/O lines 68 can be provided as the switching circuit 8.

Incidentally, in the example shown in FIG. 1A, the description has been given of the case where the present invention has been applied to a DRAM. However, the present invention is generally applicable to a semiconductor memory device having a mode in which a reading operation is performed in order in one operating cycle.

As described above, since a latch circuit 7 which temporarily holds a data signal for writing in a read-write operation is provided in the DRAM shown in FIG. 1A, the reading operation and the writing operation are performed concurrently within a certain period of a row address strobe cycle. Accordingly, a cycle time required for a read-write operation is reduced. This idea is applicable to usual semiconductor memories. In other words, since the semiconductor memory device according to the present invention includes a latch means which latches the data signal to be written in response to the state control signal from the outside and a switching means which is connected between the latch means and an I/O line means to operate in response to the writing control signal from the outside, it can perform the reading operation for the data signal in the memory array and the operation for latching the data signal to be written into the latch means concurrently in a certain period. Accordingly, the time required for the operating cycle for performing the reading operation and the writing operation in order can be shortened.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device adapted to perform a reading operation and a writing operation in a single operating cycle specified by one cycle of a first state control signal for controlling a state of said device, said device comprising:
    first means for receiving an output enable signal, a write enable signal and said first state control signal from an external source,
    a memory array having memory cells for storing a first data signal, the first data signal stored in a memory cell of said memory array being read out in response to a second state control signal, I/O lines means connected to said memory array for inputting/outputting a data signal to/from said memory array, latch means connected to receive a second data signal to be written for latching the second data signal in response to the first state control signal, output buffer means connected to receive the first data signal from the memory cell of said memory array via said I/O lines means, said output buffer means receiving the first data signal from said memory array in response to the second state control signal and the output enable signal, and then outputting the first data signal, switching means connected between said latch means and said I/O lines means, said switching means being turned on in response to the second state control signal the second data signal, latched by said latch means, being provided to said memory array via said switching means and said I/O lines means;

wherein said second data signal is provided to said memory array via said switching means and said I/O line means and said first data signal is read out, simultaneously.

2. A semiconductor memory device according to claim 1, wherein said output buffer means comprises an amplifier means connected to said I/O line means for amplifying signals from the memory cells of said memory array.

3. A semiconductor memory device according to claim 2, wherein an amplifier activating signal for activating said amplifier means is initiated in response to said second state control signal and said output enable signal.

4. A semiconductor memory device according to claim 1, wherein only the writing operation is performed in one operating cycle, and which further comprises input buffer means, for holding the second data signal to be written in response to said first state control signal, connected to receive the second data signal from an external source, and wherein, said switching means, connected to receive signals from said latch means and said input buffer means, comprises selector means for outputting one of the signals from said latch means and said input buffer means selectively in response to the first and second state control signals, respectively, and the write enable signal.

5. A semiconductor memory device according to claim 4, further comprising writing control means operatively connected to said first means for receiving and said switching means.

6. A semiconductor memory device according to claim 1, wherein said first means for receiving comprises a clock generator.

7. A semiconductor memory device according to claim 1, wherein said semiconductor memory device comprises a dynamic random access memory device.

8. A semiconductor memory device according to claim 7, wherein said first state control signal comprises a row address strobe signal and said second state control signal comprises a column address strobe signal.

9. In a semiconductor memory device which performs a reading operation and a writing operation in a single operating cycle specified by one cycle of a first state control signal for controlling a state of said device, said device comprising means for receiving a write enable signal, an output enable signal and said first state control signal from an external source, a memory array having memory cells for storing data signals, I/O line means connected to said memory array for inputting and outputting data signals to said memory array, output buffer means connected to receive a first data signal from the memory cell of said memory array via said I/O line means, latch means connected to receive a second data signal to be written from an outside source, and switching means connected between said latch means and said I/O lines means, a method of operating said semiconductor memory device comprising the steps of:

latching the second data signal by the latch means in response to the first state control signal, providing the first data signal stored in the memory cell of the said memory array to said output buffer means via said I/O line means in response to a second state control signal, outputting the first data signal held in said output buffer means in response to the output enable signal, turning on said switching means in response to said second state control signal, and providing the second data signal latched in the said latch means to said memory array via said switching means and said I/O line means, simultaneously with the outputting of said first data signal.

10. A semiconductor memory device according to claim 9, wherein said semiconductor memory device comprises a dynamic random access memory device.

* * * * *